April 8, 1969 C. W. SMITH 3,437,883
MICROMODULAR ELECTRONIC PACKAGE UTILIZING
CANTILEVERED SUPPORT LEADS
Filed Dec. 9, 1966

INVENTOR.
CHARLES W. SMITH
BY
Roger A. Marro

United States Patent Office 3,437,883
Patented Apr. 8, 1969

3,437,883
MICROMODULAR ELECTRONIC PACKAGE UTILIZING CANTILEVERED SUPPORT LEADS

Charles W. Smith, Canoga Park, Calif., assignor to The Bunker-Ramo Corporation, Canoga Park, Calif., a corporation of Delaware Filed Dec. 9, 1966, Ser. No. 600,640
Int. Cl. H02b *1/04, 1/10*
U.S. Cl. 317—101 7 Claims

ABSTRACT OF THE DISCLOSURE

A micromodular electronic circuit package constructed so as to avoid damaging effects of temperature variations. The package can include a plurality of stacked component laden substrates with each substrate being physically supported on and electrically connected to, the ends of a different set of conductive pins extending through a case bottom portion. The pins are secured to the case bottom portion so that the pin portions extending to the substrates are effectively cantilevered whereby they may flex to adjust to relative expansion between the case bottom portion and the substrate without subjecting the pin-substrate connections to excessive shear forces.

This invention relates to eelctronic microminiature packed modules and, more particularly, to a novel temperature compensated module package for component laden substrates that is adapted to compensate for temperature differentials encountered by the module during operation so that reliable mechanical and electrical securement exists between the connector pins of the module and the conductive pads carried on the substrates.

As the usefulness of electronic equipment has expanded with the increase in technological improvement and with the widening demand, both militarily and commercially for electronic equipment capable of handling vast quantities of information at increased rates of speed, the need for high density electronic packaging has become of increasing importance. A concomitant of this trend is the need for circuit protection which, while providing the requisite component density, maintains both system reliability and serviceability. Under the thrust of this expanding use, it has become an economic necessity to provide circuit interconnecting means for electronic equipment which both minimizes the possibility of error in field maintenance procedures and reduces overall system complexity.

With increasing component packaging density, the reliability of circuit interconnections has become of paramount significance. Particularly, this is true with respect to the design, construction and interconnection of circuit components and assemblages which carry out the basic work function of the electronic equipment. The basic circuits employed in electronic equipment lend themselves to compact arrangement on substrates in thin film semiconductor form as well as on printed circuit boards or cards wherein discrete components are employed. The substrate or printed circuit board generally carries strips of conductive material disposed in a predetermined pattern terminating in conductive pads arranged along one end of the substrate or board which are employed for external connection purposes so as to permit interconnection of the circuit carried on the substrate or board with other associated circuits mounted on the electronic equipment.

One means for making mechanical and electrical contact with the conductive pads on a substrate or circuit board comprises the use of pins or leads that are attached to the respective conductive pads at one end and having their opposite ends exposed exteriorly of the packaging module for external connection with other equipment such as a larger printed circuit board. Normally, the pins or leads are attached to the conductive pads by means of hand soldering, welding or bonding techniques, and the substrates, including the pins or leads, are then mounted in a suitable case. Next, a suitable potting compound is used to encapsulate both the active and passive devices carried on the substrate as well as the pins and lead connections with the conductive pads. In this fashion, a micromodular package is produced.

However, problems and difficulties have been encountered when fabricating such a modular package which stem largely from the fact that many of the fabricating procedures require hand or manual operations which are time consuming, and such fabrication procedures are susceptible to inaccuracies and faulty connections caused by human error. Also, the substrate material, potting compound, and the package casing material generally have different coefficients of expansion so that when the module is subjected to temperature cycling during the operation of the unit within its given environment, the securement between the pins or leads with the respective conductive pads has a tendency to shear and interrupt circuit continuity.

Accordingly, the present invention obviates the difficulties and problems encountered with conventional micromodular circuit packages by providing a plurality of electrical component laden substrates in a unitary module whereby the pins or leads attaching to the substrates are readily secured thereto in mass to reduce hand labor costs and to protect active and passive components assembled on the substrates. Generally, the pins or lead attachments to the substrate are capable of adjusting for temperature differentials encountered by the package so that a reliable mechanical and electrical securement is maintained between the leads and the substrates. By installing the leads or pins so as to be cantilevered from the housing or case, the substrates mounted thereon are adapted to float and deflect in air in accordance with material elasticity variations brought about by changes in temperature. Inasmuch as the lead pins and substrates are in open air, deflection of the lead pins takes place as a unit within the housing or case without subjecting the attachment points to undesirable shear forces.

In one embodiment of the invention, an open housing is employed that includes side walls and a bottom portion of substantially the same thickness wherein the opening of the housing serves as an entrance to an interior cavity in which a plurality of substrates carrying electrical components are mounted in an inverted fashion so that the components face the bottom portion. The electrical components may take the form of any active or passive elements. A plurality of leads or pins are secured to the bottom portion of the case or housing so that given lengths of the pins extend externally of the housing that are adapted to mate with plug-in sockets or the like carried on a larger printed circuit board. The opposite ends of the pins extend or project into the cavity of the housing. A selected number of pins extend into the cavity for a predetermined distance, while the projecting ends of other selected pins extend further into the cavity so that a plurality of substrates may be stacked in fixed parallel spaced relationship within the housing cavity. The ends of the leads or pins in the cavity are pre-tinned such as by being provided with a ball of solder, and the ends of the leads or pins to be attached to each substrate are indexed in registry with the conductive pads forming part of the circuitry carried on one side of the substrate.

A heating element may be lowered into the cavity into contact with the back side of each substrate to effect a solder bond between the pins and the conductive pads. Preferably, a heat sink may be provided in the center of the heating block to protect the electrical components on the substrates from being subjected to extreme temperatures.

The pins serve as cantilevered elements which float and deflect to compensate for changes in ambient temperature such that the securement between the pins and the substrates will not shear or break. A feature of the invention resides in maintaining a small gap between the peripheral edge of the uppermost substrate in the stack and the side walls defining the opening to the cavity of the housing so that as the module is subjected to a varying range of temperature cycling, the substrate material as well as the pin material can expand or contract without shearing the solder attachment therebetween. For a given pin material modulus of elasticity, the magnitude of the force producing a specific deformation is proportional to the cross-sectional area of the pins. Therefore, the smaller the pin, the greater the deflection for a given force at the attachment point, but the smaller the pin, the less shear force the attachment joint is capable of sustaining.

The features of the present invention which are believed to be novel are set forth with particularity in the appended claims. The present invention, both as to its organization and manner of operation, together with further objects and advantages thereof, may best be understood by reference to the following description taken in connection with the accompanying drawing, in which:

Figure 1:
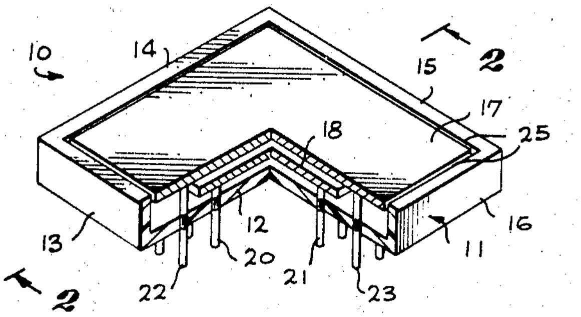
FIGURE 1 is a perspective view of the novel temperature compensating packaging module of the present invention having a portion thereof broken away to illustrate the stacking arrangement of the respective substrates carried therein.

Referring to FIG. 1, a temperature compensated micromodular package is illustrated in the general direction of arrow 10 which embodies the concept of the present invention. The package 10 includes a case 11 having a bottom wall portion 12 and side wall portions 13–16 that define an inner cavity in which a pair of substrates 17 and 18 are located. Preferably, the substrates are composed of material such as glazed aluminum which has a linear coefficient of expansion in the range of $6\times10^{-6}/°$ C., and the material for the box or case 11 may be of some phenolic composition having a linear coefficient of expansion in the range of $12\times10^{-6}/°$ C.

It is to be noted that the substrate 18 is carried on a plurality of leads or pins, such as pins 20 and 21, while substrate 17 is carried on leads or pins 22 and 23. It is pointed out that the pins project beyond the bottom portion 12 into the cavity by a distance which is large compared to the pin diameter. A conformal coating 24 of a suitable silastic material such as Dow Corning Sylgard 184 or Hysol 12–056 is applied over the component carrying side of each of the substrates to protect the components and lead attachments on the substrates from any adverse effects encountered with minute foreign matter or contamination. Also, a slight gap 25 is provided between the peripheral edge of the uppermost substrate 17 and the inner wall surfaces of the side walls 13–16 inclusive so that the cantilevered pins and substrates form a unitary structure adapted to move in its surrounding atmosphere.

Figure 2:
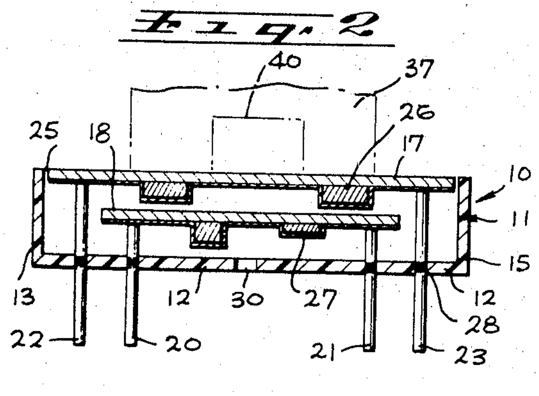
FIG. 2 is a cross-sectional view of the packaging module of FIG. 1 as taken in the direction of arrows 2—2 thereof.

Referring now in detail to FIG. 2, the micromodular package 10 more clearly illustrates a variety of active and passive electrical components, such as components 26 and 27 that are carried on the respective substrates 17 and 18. Furthermore, it is to be noted that the plurality of pins for mounting the substrates are suitably secured to the bottom portion 12 of the case 11 such as by molding, for example. Preferably, the portions of the pins molded with the case are provided with a plurality of serrations, such as are represented by numeral 28, so that the pins are steadfastly held to the case and rendered immobile. Selected pins, such as those represented by numerals 20 and 21, are located in parallel rows and have a given length extending into the cavity of the case for a predetermined distance, whereby the terminating ends of the pins serve to mount and support the substrate 18. However, another selected plurality of pins, such as are represented by the pins 22 and 23, are arranged in parallel rows between the rows of pins represented by pins 20 and 21 and the inner surfaces of side walls 13 and 15, respectively. These latter selected pins have a given length projecting into the cavity for a substantially greater distance than the pins 20 and 21 so that the substrate 17 can be supported over the top of substrate 18 with sufficient clearance to prevent the components 26 carried thereon from engaging with the rear side of substrate 18. In this fashion, it can be seen that a plurality of substrates may be suitably stacked within the cavity defined by the case side walls. Towards this end, the overall dimension of each of the substrates must diminish from the uppermost substrate, such as substrate 17, to the lowermost substrate, such as substrate 18, so that the supporting pins for each of the substrates in the stack will not touch or abut against the edges of any other substrate in the stack.

Bottom 12 of the case 11 is provided with an opening 30 through which the conformal coating 24 may be introduced into the case cavity. Preferably, the coating compound may take the form of a semi-rigid epoxy that is introduced through aperture 30 and directed to flow around the components carried on each of the substrates to totally coat the electrical components carried on the substrates. However, the coating compound should be thin enough, prior to curing, to flow through the gap 25 in the event the compound collects in the gap. Preferably, the gap 25 is no larger than .0005 inch.

Figure 3:
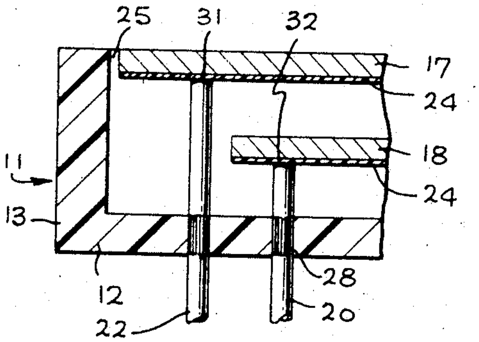
FIG. 3 is an enlarged fragmentary view of the packaging module illustrating the connection of a connector pin to a conductor pad carried on the substrate.

Referring now to FIG. 3 in detail, a greatly enlarged fragmentary view of the micromodular package 10 is illustrated wherein the securement of the ends of pins 20 and 22 with conductive pads carried on the substrates 17 and 18 are indicated by numerals 31 and 32, respectively. The diameters of the pins 20 and 22 are on the order of 18 mils so that the attachment area is extremely small, whereby, in the absence of the present invention, relatively minor shifts of the pins with respect to the substrates would cause excessive shear loads to be placed on the attachment points, causing these points to break or sever. Attachment of the conductive pads on the substrate to the ends of the pins may be achieved by soldering, welding, or any suitable bonding technique. However, it has been found desirable when employing a solder connection to pre-tin both the conductive pads and the ends of the pins so that a proper mechanical and electrical connection can be made by merely introducing heat to the attachment area.

Figure 4:
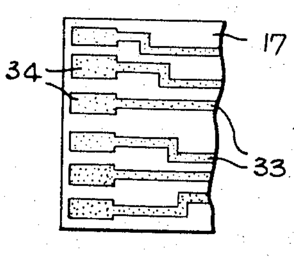
FIG. 4 is a plan view of a typical printed circuit substrate or board displaying a plurality of circuit conductive pads.

Referring now to FIG. 4 in detail, a typical substrate is illustrated that may be referred to as substrate 17. The substrate includes a plurality of strips of conductive material such as strip 33, that terminates in a conductive pad such as is represented by numeral 34. The conductive pads are each registered with respective pins prior to securement. The substrate 17 may take the form of a miniaturized metal plate or wafer or, in some instances, the substrate may take the form of a printed circuit board of thicker dimension and size.

Figure 5:
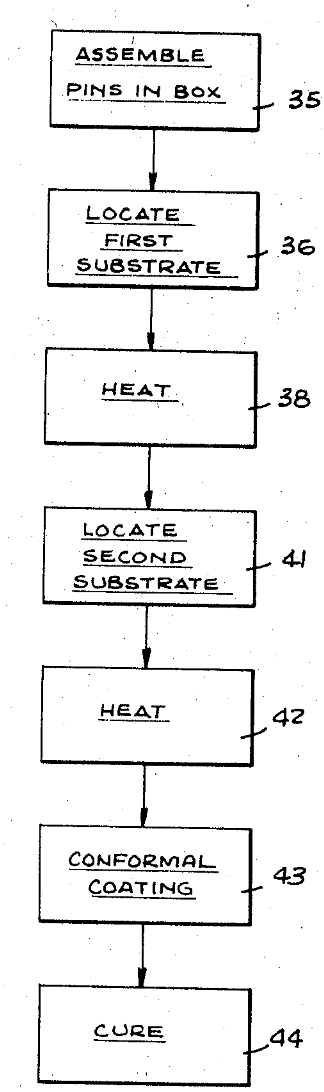
FIG. 5 is a block diagram showing the sequence of steps taken to fabricate the embodiment of the present invention shown in FIGS. 1–3 inclusive.

In FIG. 5, the sequence of steps employed to fabricate the micromodular package 10 is illustrated. Initially, the substrate is prepared with its particular pattern of conductive strips and conductive pads 34 along with the mounting of the various electrical components. The rows of pins are assembled (35) in the box 11 so that a first set of pins is provided having their terminal ends lying in a common plane within the cavity of the box, while the terminating ends of other selected pins reside in common in another plane within the cavity of the box. Next, the first substrate 18, of lesser dimension, is located (36) within the cavity of the case so that particular conductive pads 34 mate and register with selected pins 20 and 21 in the first plane. Assuming that the attachment is to be achieved via solder connection and that the ends of the pins as well as the conductive pads are pre-tinned with solder, a heat block 37, as shown in FIG. 2, is disposed against the backside of the first substrate for a predetermined length of time sufficient to melt the solder and make proper electrical and mechanical connection between the ends of the pins and the conductive areas or pads on the substarte. The heating step (38) is relatively short inasmuch as the substrate is very thin and excessive heat will tend to alter the characteristics of the electrical components carried on the substrate. To assist in avoiding overheating, it is preferred that the heat block 37 include a heat sink 40 that may take the form of a block of beryllium copper. Once the solder has become molten, the heat block 37 may be removed.

Next, the second substrate 17 of larger dimension is located within the cavity of the box between its side walls so that selected conductive pads mate with predetermined pin ends of the pins 22 and 23 associated in the respective parallel rows. Once the second substrate has been located (41), the heat block 37 is lowered against the back side of the substrate 17 to provide sufficient heat (42) to effect a proper connection between the pin and the conductive pad.

After substrate 17 has been securely fastened to its set of supporting pins, the conformal coating 24 may be introduced through aperture 30 in the case by a suitable pressurized dispenser such as a hypodermic syringe to completely cover and coat (43) the component laden side of each substrate. To prevent the epoxy coating from collecting in the gap 25 of the package, it is preferred that during this step the package be supported over a Teflon coated plate so that the back side of substrate 17 is spaced therefrom. By this means, the coating compound 24 will flow through the gap onto the plate. Once the coating compound has been cured (44), the micromodular package 10 may be removed from the Teflon plate and the package may be placed into operation.

By constructing and fabricating a micromodular package in accordance with the present invention, it can be seen that the substrates 17 and 18 are stacked in fixed parallel spaced relationship within the housing cavity so that maximum utilization of space is achieved. Furthermore, it is to be noted that the pins are cantilevered from their securement on the bottom portion 12 of the case so that, as the package is subjected to temperature cycling, the pins, and hence the substrates, are free to deflect back and forth in response to various linear expansions of the pin material, the case material, or the substrate material, which all may have different linear coefficients of expansion. It is to be kept in mind that the amount of deflection is extremely small; however, it is sufficient to say that the substrates are relatively free to move for minute fractions of an inch to accommodate any expansion of materials due to temperature differentials encountered by the micromodular package. Such minute movement is sufficient to prevent shearing of the attachment between the pin ends and the conductive pads on the substrate. As earlier stated, for a given pin material modulus of elasticity, the magnitude of the force producing a specific deformation is proportional to the cross-sectional area of the pins. Therefore, the smaller the pin, the greater the deflection for a given force at the attachment point, but the smaller the pin, the less shear force the attachment joint is capable of sustaining.

While particular embodiments of the present invention have been shown and described, it will be obvious to those skilled in the art that changes and modifications may be made without departing from this invention in its broader aspects, and therefore the aim in the appended claims is to cover all such changes and modifications as fall within the true spirit and scope of this invention.

The embodiments of the invention in which an exclusive property or privilege is claimed are defined as follows:

1. A micromodular electronic package including at least two substrates carrying a plurality of electrical components interconnected by conductive strips which terminate in conductive pads along opposite edge marginal regions of each substrate, comprising:

a case having a bottom portion and side walls defining an opening leading into a cavity surrounded by said side walls;

a first arrangement of pins carried by said bottom portion and having terminating ends extending into said cavity for a predetermined distance, each of said pin terminating ends adapted to register with selected conductive pads on one of the substrates so that the substrate is supported thereon;

a second arrangement of pins carried by said bottom portion and having terminating ends extending into said cavity for a predetermined distance substantially greater than said first arrangement of pins, each of said pin terminating ends adapted to register with selected conductive pads on the other substrate so that the other substrate is supported thereon;

means securing said pin terminating ends to the conductive pads to provide electrical and mechanical securement therebetween; and a conformal coating means disposed in said cavity to completely cover the component side of each substrate.

2. The invention as defined in claim 1 wherein the substrates are of different dimensions and are related with respect to said arrangements of pins so as to be mounted thereon in a stack.

3. A micromodular electronic package including at least two substrates each having conductive pads formed on one surface thereof, said package comprising:

a case having a bottom portion;

a first arrangement of pins carried by said bottom portion and having terminating ends extending beyond said bottom portion by a predetermined distance, each of said pin terminating ends adapted to register with selected conductive pads on one of the substrates so that the substrate is supported thereon;

a second arrangement of pins carried by said bottom portion and having terminating ends extending beyond said bottom portion by a predetermined distance greater than said first arrangement of pins, each of said pin terminating ends adapted to register with selected conductive pads on the other substrate so that the other substrate is supported thereon; and means securing said pin terminating ends to the conductive pads to provide electrical and mechanical securement therebetween.

4. The micromodular electronic package of claim 3 wherein said case has side walls projecting substantially perpendicularly from said bottom portion to define a cavity therebetween; and wherein said substrates are supported within said cavity with the peripheral edges thereof disposed close to said side walls.

5. The micromodular package of claim 3 wherein electronic components are carried on the surface of at least one of said substrates opposed to said case bottom portion.

6. The micromodular electronic package of claim 5 wherein said bottom portion includes an opening providing access to said cavity for enabling a conformal coating to be applied therethrough to the surfaces of said substrates.

7. The micromodular electronic package of claim 3 wherein the linear coefficients of expansion of the materials forming said substrates, said case, and said pins cooperate to allow minute relative movement between said substrates and said case without subjecting the engagements between said pins and said substrates to excessive shear forces.

References Cited

UNITED STATES PATENTS

| | | | |
|---|---|---|---|
| 2,919,386 | 12/1959 | Ross | 29—589 X |
| 3,239,719 | 4/1966 | Shower. | |
| 3,262,023 | 7/1966 | Boyle. | |
| 3,324,357 | 6/1967 | Hill | 317—234.4 |
| 2,963,632 | 12/1960 | Kilian et al. | |

OTHER REFERENCES

Warner, Jr. et al. (Editor), Integrated Circuits, The TO-5 Package, McGraw-Hill, N.Y., 1965, TK7870M63C3, pp. 358, 359.

ROBERT K. SCHAEFER, *Primary Examiner.*

D. SMITH, Jr., *Assistant Examiner.*

U.S. Cl. X.R.

174—52